US007874067B1

(12) United States Patent
Hiew et al.

(10) Patent No.: US 7,874,067 B1
(45) Date of Patent: Jan. 25, 2011

(54) MANUFACTURING METHOD FOR SINGLE CHIP COB USB DEVICES WITH OPTIONAL EMBEDDED LED

(75) Inventors: Siew S. Hiew, San Jose, CA (US); Frank I-Kang Yu, Palo Alto, CA (US); Nan Nan, San Jose, CA (US); Paul Hsueh, Concord, CA (US); Abraham C. Ma, Fremont, CA (US); Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 406 days.

(21) Appl. No.: 12/137,432

(22) Filed: Jun. 11, 2008

Related U.S. Application Data

(60) Continuation-in-part of application No. 11/773,830, filed on Jul. 5, 2007, and a continuation-in-part of application No. 12/099,421, filed on Apr. 8, 2008, and a continuation-in-part of application No. 10/888,282, filed on Jul. 8, 2004, and a continuation-in-part of application No. 11/309,594, filed on Aug. 28, 2006, now Pat. No. 7,383,362, which is a continuation-in-part of application No. 10/707,277, filed on Dec. 2, 2003, now Pat. No. 7,103,684, application No. 12/137,432, which is a continuation-in-part of application No. 11/624,667, filed on Jan. 18, 2007, which is a division of application No. 09/478,720, filed on Jan. 6, 2000, now Pat. No. 7,257,714.

(51) Int. Cl.
*H05K 3/30* (2006.01)
*G06F 13/36* (2006.01)

(52) U.S. Cl. .................... 29/832; 29/831; 29/841; 29/843; 29/854; 29/860; 710/313

(58) Field of Classification Search .............. 29/832, 29/830, 831, 848, 854, 860, 858, 843, 842; 710/301, 302, 303, 313, 62, 72; 713/1, 2, 713/167, 185, 186, 193; 439/638, 136; 382/115, 382/116; 361/67, 9, 31; 174/504
See application file for complete search history.

(56) References Cited

U.S. PATENT DOCUMENTS

| | | |
|---|---|---|
| 5,623,552 A | 4/1997 | Lane |
| 5,907,856 A | 5/1999 | Estakhri et al. |
| 5,959,541 A | 9/1999 | DiMaria et al. |
| 6,000,006 A | 12/1999 | Bruce et al. |
| 6,012,636 A | 1/2000 | Smith |
| 6,069,920 A | 5/2000 | Schulz et al. |

(Continued)

*Primary Examiner*—Derris H Banks
*Assistant Examiner*—Tai Nguyen
(74) *Attorney, Agent, or Firm*—Blakely Sokoloff Taylor & Zafman LLP

(57) ABSTRACT

According to certain embodiments of the invention, a single chip COB USB manufacturing is using chip-on-board (COB) processes on a PCB panel with multiple individual USB PCB substrates. This single chip COB USB is laid out in an array of N×M matrixes. The advantages of this method are: 1) use molding over PCBA, versus conventional of using SMT process to mount all necessary component on substrate to form PCBA; 2) simpler rectangular structure to fit any external decorative shell package for added value; and 3) package is moisture resistance if not water proof.

3 Claims, 23 Drawing Sheets

U.S. PATENT DOCUMENTS

| | | | |
|---|---|---|---|
| 6,081,858 A | 6/2000 | Abudayyeh et al. | |
| 6,125,192 A | 9/2000 | Bjorn et al. | |
| 6,148,354 A * | 11/2000 | Ban et al. | 710/301 |
| 6,193,152 B1 | 2/2001 | Fernando et al. | |
| 6,202,138 B1 | 3/2001 | Estakhri et al. | |
| 6,230,233 B1 | 5/2001 | Lofgren et al. | |
| 6,275,894 B1 | 8/2001 | Kuo et al. | |
| 6,321,478 B1 | 11/2001 | Klebes | |
| 6,438,638 B1 * | 8/2002 | Jones et al. | 710/301 |
| 6,547,130 B1 | 4/2003 | Shen | |
| 6,547,597 B2 * | 4/2003 | Harris, IV | 439/620.22 |
| 6,636,929 B1 | 10/2003 | Frantz et al. | |
| 6,718,407 B2 | 4/2004 | Martwick | |
| 6,880,024 B2 | 4/2005 | Chen et al. | |
| 6,932,629 B2 * | 8/2005 | Ikenoue | 439/138 |
| 7,103,684 B2 * | 9/2006 | Chen et al. | 710/62 |
| 7,103,765 B2 | 9/2006 | Chen | |
| 7,249,978 B1 | 7/2007 | Ni | |
| 7,257,714 B1 | 8/2007 | Shen | |
| 7,264,992 B2 | 9/2007 | Hsueh et al. | |
| 2001/0043174 A1 | 11/2001 | Jacobsen et al. | |
| 2002/0166023 A1 | 11/2002 | Nolan et al. | |
| 2003/0046510 A1 | 3/2003 | North | |
| 2003/0163656 A1 | 8/2003 | Ganton | |
| 2004/0148482 A1 | 7/2004 | Grundy et al. | |
| 2004/0255054 A1 | 12/2004 | Pua et al. | |
| 2005/0102444 A1 | 5/2005 | Cruz | |
| 2005/0160213 A1 | 7/2005 | Chen | |
| 2005/0193161 A1 | 9/2005 | Lee et al. | |
| 2005/0246243 A1 | 11/2005 | Adams et al. | |
| 2005/0268082 A1 | 12/2005 | Poisner | |
| 2006/0065743 A1 | 3/2006 | Fruhauf | |
| 2006/0075174 A1 | 4/2006 | Vuong | |
| 2006/0106962 A1 | 5/2006 | Woodbridge et al. | |
| 2006/0161725 A1 | 7/2006 | Lee et al. | |
| 2006/0206702 A1 | 9/2006 | Fausak | |
| 2006/0242395 A1 | 10/2006 | Fausak | |
| 2007/0079043 A1 | 4/2007 | Yu et al. | |
| 2007/0094489 A1 | 4/2007 | Ota et al. | |
| 2007/0113067 A1 | 5/2007 | Oh et al. | |
| 2007/0113267 A1 | 5/2007 | Iwanski et al. | |
| 2007/0130436 A1 | 6/2007 | Shen | |

* cited by examiner

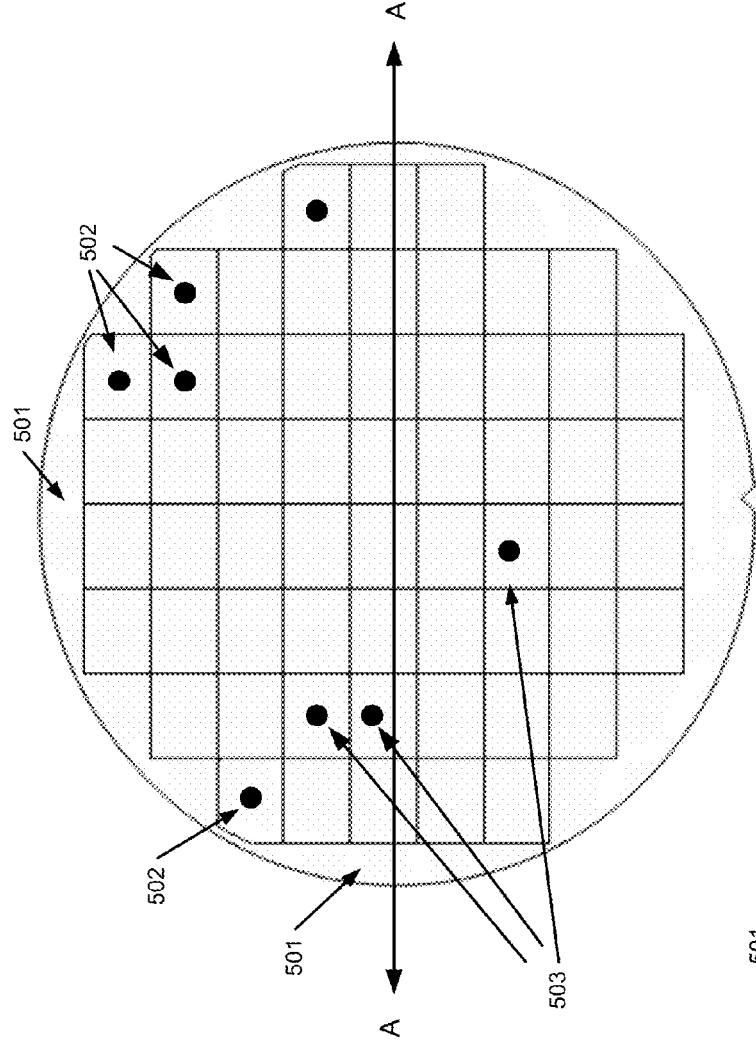
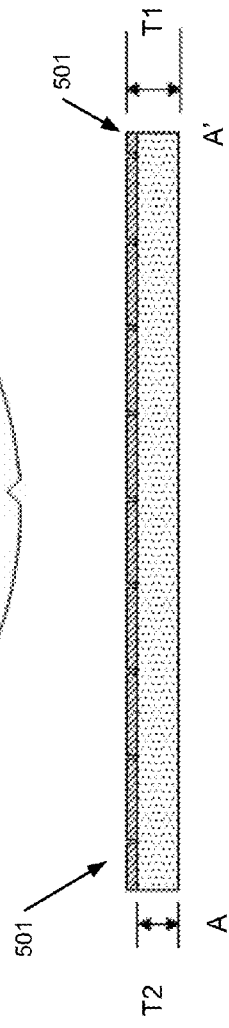
FIG. 5A
FIG. 5B
FIG. 5C

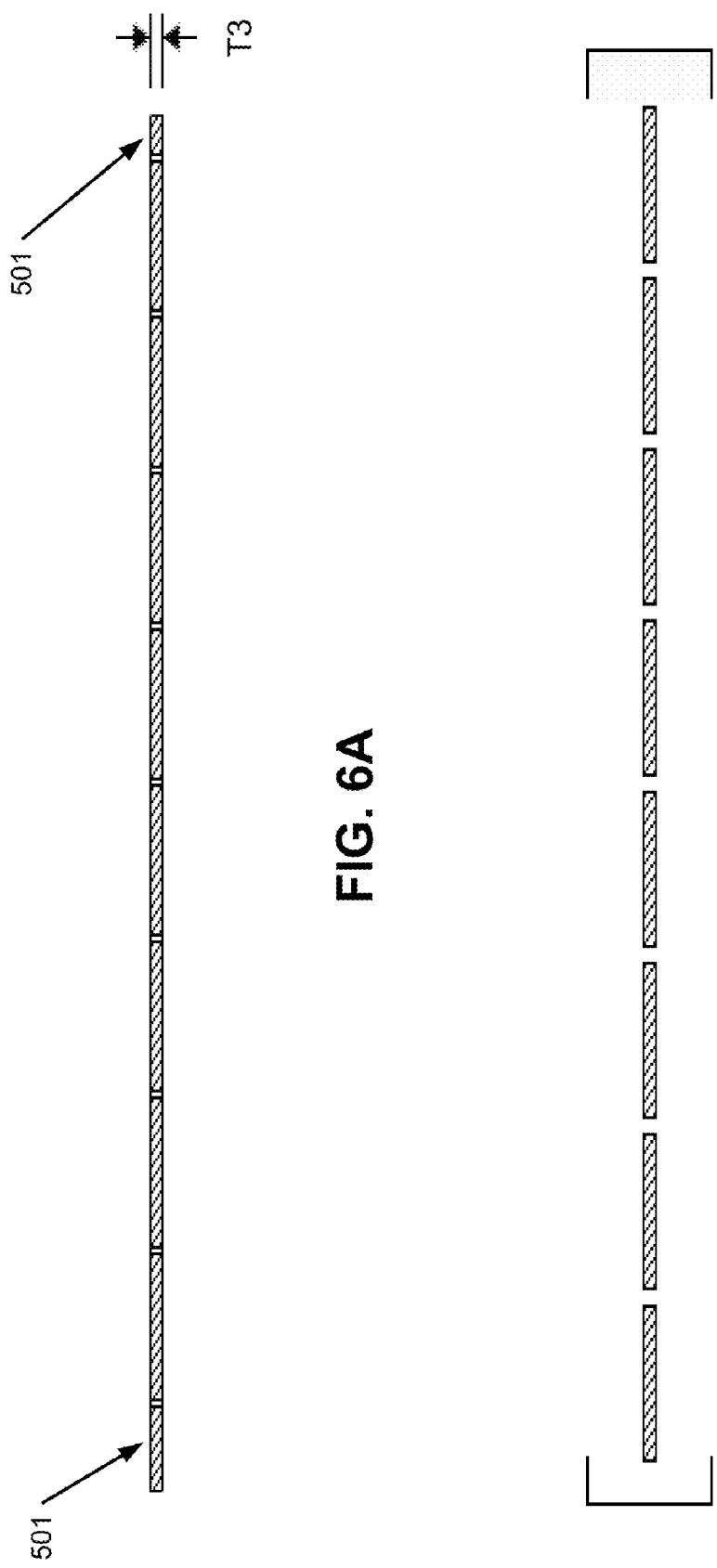

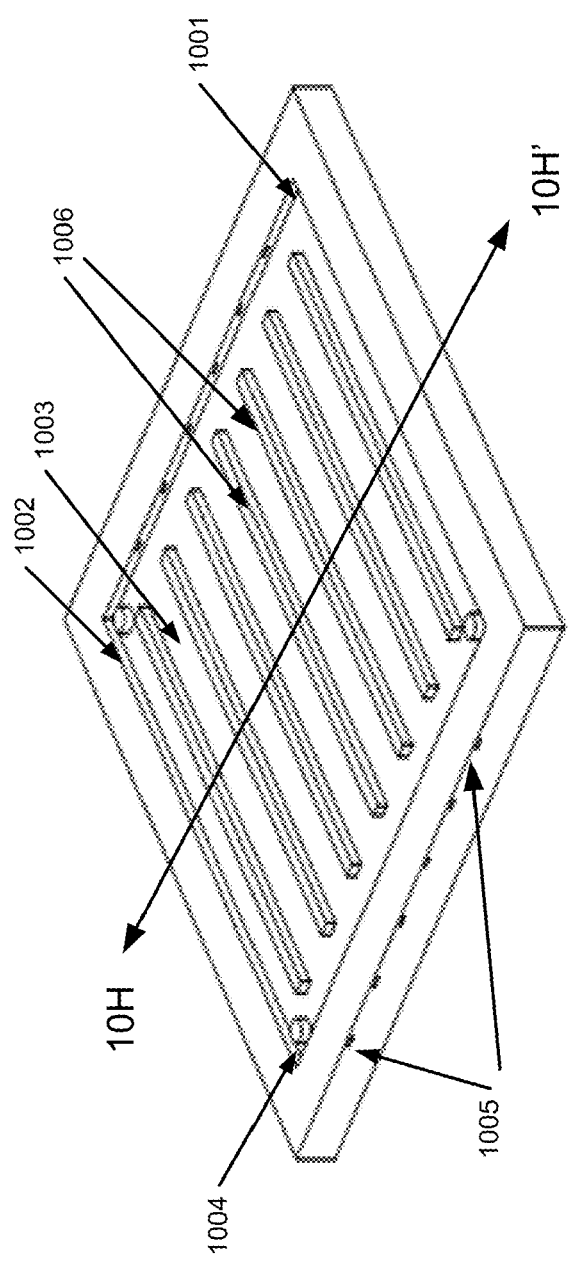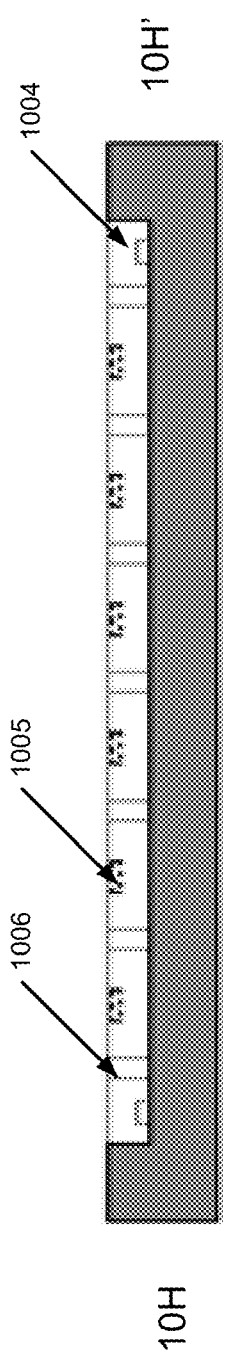
FIG. 10A
FIG. 10B

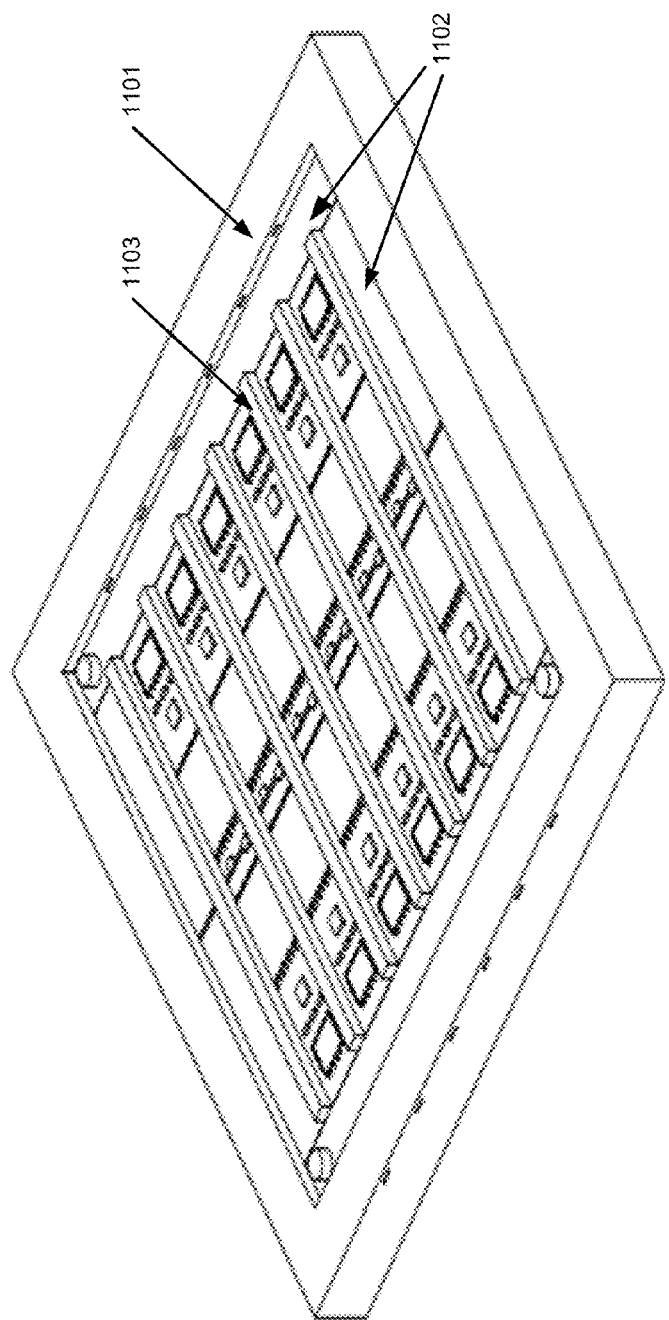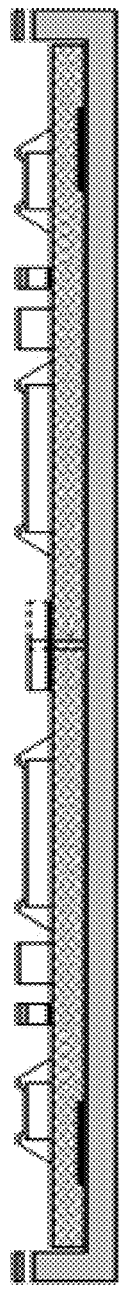
FIG. 11A
FIG. 11B

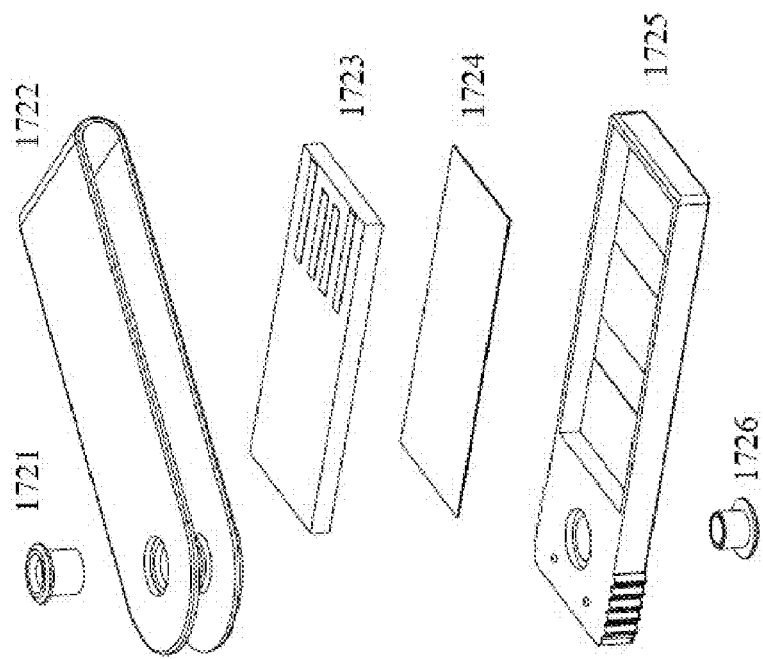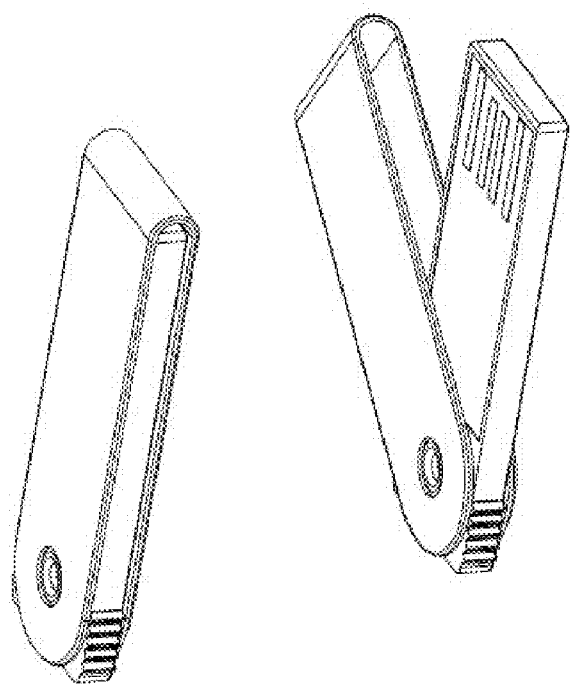
FIG. 17C

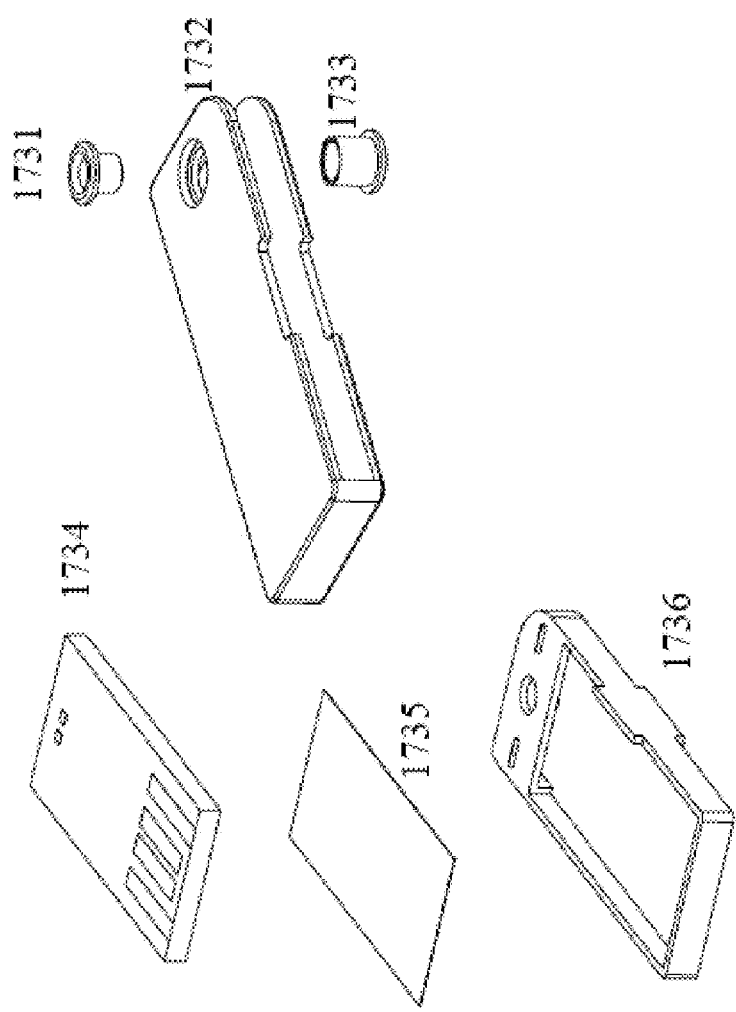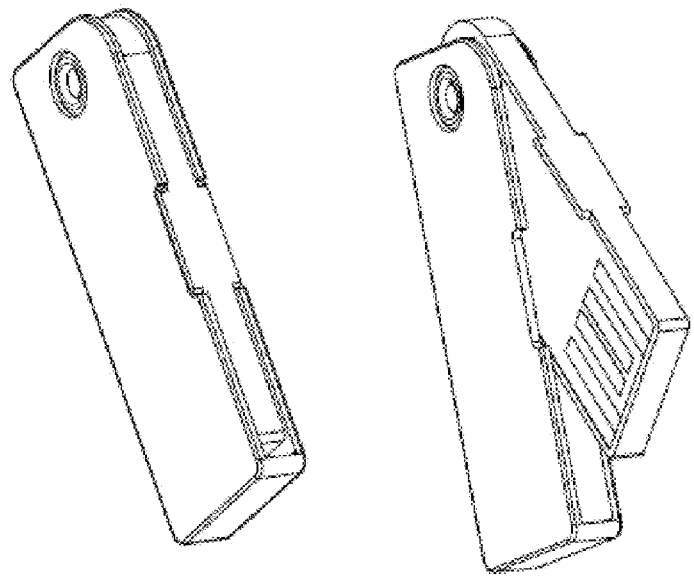
FIG. 17D

MANUFACTURING METHOD FOR SINGLE CHIP COB USB DEVICES WITH OPTIONAL EMBEDDED LED

CROSS-REFERENCE TO RELATED APPLICATIONS

This application is a continuation-in-part (CIP) of co-pending U.S. Patent application for "Molding Method to Manufacture Single-Chip Chip-On-Board USB Device", U.S. application Ser. No. 11/773,830, filed Jul. 5, 2007.

This application is also CIP of co-pending U.S. Patent application for "Flash Memory Devices with Security Features", U.S. application Ser. No. 12/099,421, filed Apr. 8, 2008.

This application is also CIP of co-pending U.S. Patent application for "Manufacturing Method For Memory Card", U.S. application Ser. No. 10/888,282, filed Jul. 8, 2004.

This application is also CIP of co-pending U.S. Patent application for "Single-Chip Multi-Media Card/Secure Digital (MMC/SD) Controller Reading Power-on Boot Code from Integrated Flash Memory for User Storage", U.S. application Ser. No. 11/309,594, filed Aug. 28, 2006, which is a CIP of U.S. Patent application for "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is a CIP of co-pending U.S. Patent Application for "Electronic Data Storage Medium with Fingerprint Verification Capability", U.S. application Ser. No. 11/624,667, filed on Jan. 18, 2007, which is a divisional application of U.S. patent application Ser. No. 09/478,720, filed on Jan. 6, 2000, now U.S. Pat. No. 7,257,714.

The disclosure of the above-identified U.S. patent applications and patents is incorporated herein in its entirety.

FIELD OF THE INVENTION

The invention relates to flash memory devices, more particularly to a molding process for assembling flash memory devices.

BACKGROUND OF THE INVENTION

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity.

A conventional method of manufacturing micro flash memory cards is to use either pre-molded one sided or two sided package with large enough cavity to hold the rectangular micro flash memory card block by gluing to the package's cavity. The package can fall apart as the adhesive quality degraded.

The conventional method has a limitation as assembly packaged memory and controller chips have larger dimension than the bare die plus the pads of COB (chip-on-board). Other disadvantages of the conventional method are: 1) the package has limited Z-height to stack chips to increase memory capacity; 2) there are more process variables to cause open and short defect that causes lower yield; 3) water and moisture can penetrate the shell package to corrode the leads of the components and cause reliability problem and shorten the useful life time of the device; and 4) the shell package internal cavity has to conform to the changing contour of the components on PCBA (printed circuit board assembly).

BRIEF SUMMARY OF THE INVENTION

According to certain embodiments of the invention, a single chip COB USB manufacturing is using chip-on-board (COB) processes on a PCB panel with multiple individual USB PCB substrates. This single chip COB USB is laid out in an array of N×M matrixes. The advantages of this method are: 1) use molding over PCBA, versus conventional of using SMT process to mount all necessary component on substrate to form PCBA; 2) simpler rectangular structure to fit any external decorative shell package for added value; and 3) package is moisture resistance if not water proof.

BRIEF DESCRIPTION OF THE DRAWINGS

These and other features, aspects, and advantages of the present invention will be better understood with regard to the following description, appended claims, and accompanying drawings as follows:

FIGS. 5A-5C show a PCB panel in different views as part of a wafer back grinding process according to one embodiment of the invention.

FIGS. 6A-6B show a PCB panel in different views as part of a wafer dicing process according to one embodiment of the invention.

FIGS. 10A-13D show a molding block in different views as part of a molding process according to certain embodiments of the invention.

FIGS. 17A-17E show examples of package form factors which may be used with an embodiment of the invention.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Figure 2:
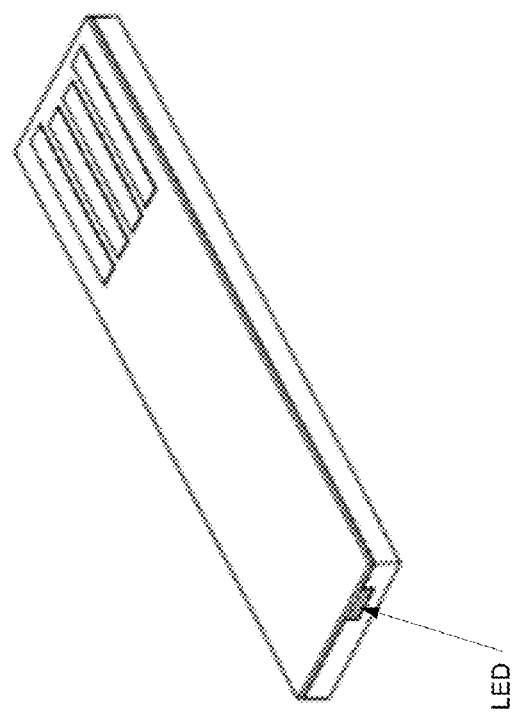
FIGS. 1-2 show a single chip COB USB device with an optional LED in a top and bottom views according to one embodiment.
Figure 1:
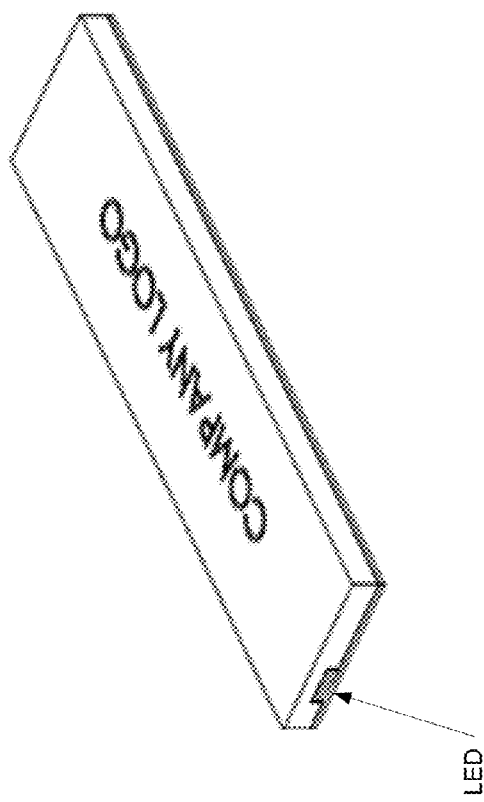

According to certain embodiments of the invention, a single chip COB USB manufacturing is using chip-on-board (COB) processes on a PCB panel with multiple individual USB PCB substrates. This single chip COB USB is laid out in an array of N×M matrixes. The advantages of this method are: 1) use molding over PCBA, versus conventional of using SMT process to mount all necessary component on substrate to form PCBA; 2) simpler rectangular structure to fit any external decorative shell package for added value; and 3) package is moisture resistance if not water proof. A finished single chip COB USB device having an optional LED (light emitted diode) is shown in FIGS. 1-2 as a top view and a bottom view respectively.

In one embodiment, the final product is a single piece versus two or three pieces glued up pieces. This single piece would not separate from pieces. It has high water and moisture resistance; low cost and fast manufacturing throughput; no seam and aesthetically more appeasing; and can stack more layers of flash memory die. As a result, this method maximizes XY spaces to accommodate larger size flash memory die.

Figure 3:
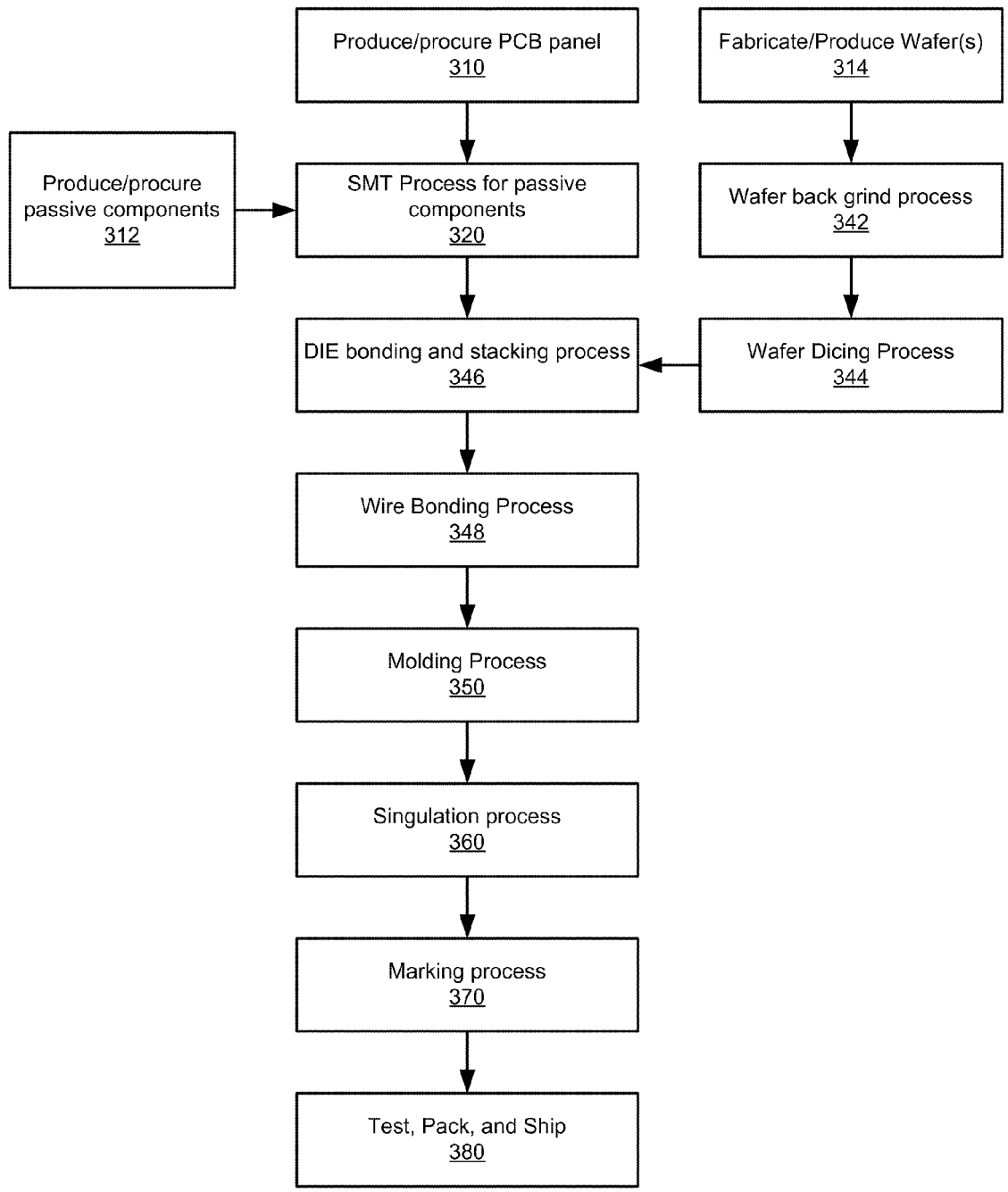
FIG. 3 is a flow diagram illustrating a process for manufacturing a single chip COB USB device with an optional LED according to one embodiment.
Figure 4A:
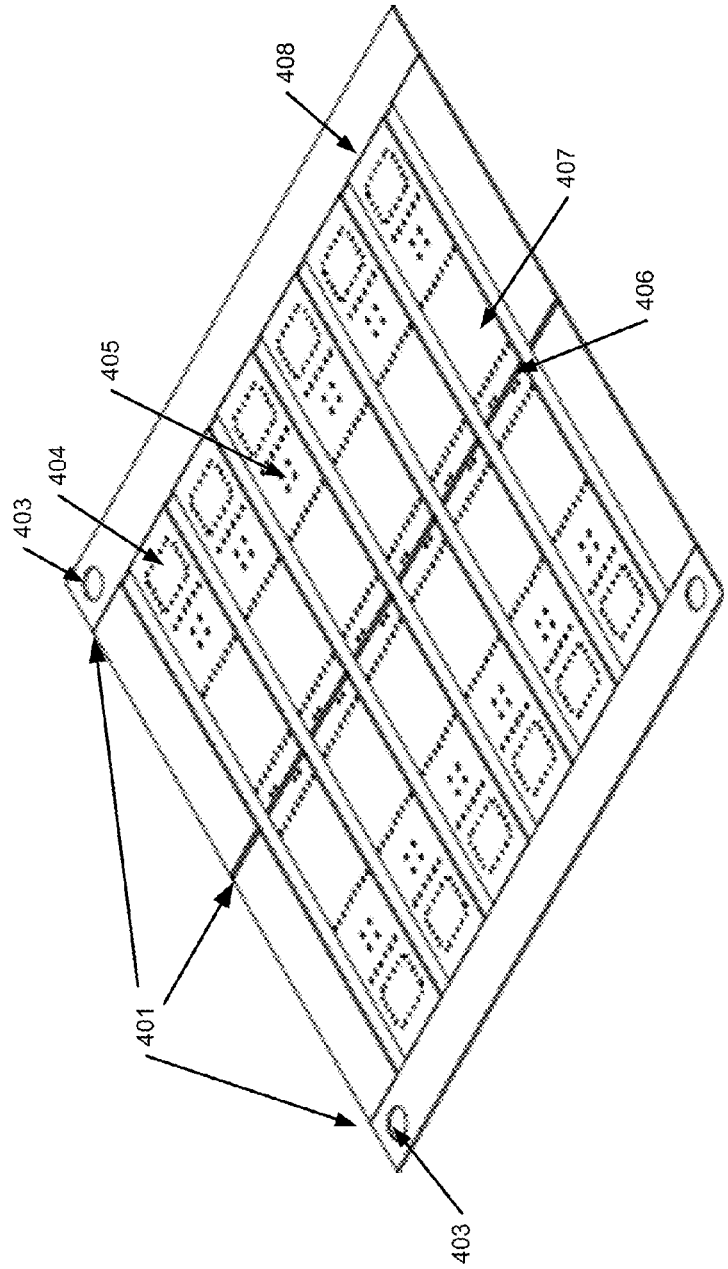
FIGS. 4A-4B show a PCB panel in different views as part of a procuring process according to one embodiment of the invention.
Figure 4B:

FIG. 3 is a flow diagram illustrating an example of a process for manufacturing single chip COB USB devices according to one embodiment of the invention. Referring to FIG. 3, during produce/procure PCB panel process 310, according to one embodiment, printed circuit boards are provided in a panel form in an N×M layout. The PCB panel used in this embodiment herein is made up of a 2×6 matrix of individual USB PCBs as shown in FIG. 4A (top side) and FIG. 4B (cross sectional view). Referring to FIGS. 4A-4B, the major characteristics of the PCB panel include a singulation cut lines 401 (horizontal cut lines only), which may be used to cut or separate the individual PCBs from the PCB panel in a single direction cut. The PCB panel further includes index and alignment holes 403, controller die location 404, passive components SMT (surface mount technology) pads 405, light emitting diodes (LEDs) 406, SLC (single-level cell) or MLC (multi-level cell) flash memory die 407, and single chip COB USBs outline 408.

Referring back to FIG. 3, during fabricate/produce wafer process 314 and wafer back grinding process 342, as shown in FIG. 5A which shows a representation of either a flash memory wafer or a controller wafer, the corner partial dies 502 are inked out during die probe wafer testing. The un-patterned bare silicon 501 is shown in both FIG. 5A and also shown at both ends of the cross sectional view FIG. 5B. The normal inked dies 503 are complete dies that failed electrical function or DC/AC parametric tests. The wafer is first mounted face down on a sticky tape which is pre-taped on a metal or plastic ring frame. Each of this ring-frame with wafer is loaded onto a vacuum chuck (with very leveled and flat surface) that has a diameter larger than that of the wafer. The wafer is then proceeded to be grinded down (ground) to a pre-programmed thickness T3, where T3=(T1−T2). The ground wafer is cleansed by DI (de-ionized) water during the process and also flush clean again with significant more DI water at the end of mechanical grinding process and follow by spinning the wafer at high speed to air dry the wafer. FIG. 5B shows a cross sectional view along A-A' plane of wafer before the grinding process with an original wafer thickness T1. FIG. 5C shows a cross sectional view along A-A' plane of wafer after grinding process that left a T3 thickness.

Referring back to FIG. 3, during wafer dicing process 344, the sticky tape at the front side of the wafer is removed and the wafer is once again being taped onto another new ring frame of sticky tape at the backside of the newly grinded wafer. The ring framed wafers are loaded into the circular saw machine to dice up into individual IC (integrated circuit) chip. A die saw machine is pre-programmed with correct die size information, X-axis and Y-axis scribe lanes' width, wafer thickness, and intended over cut depth. Proper saw blade width is selected based on the widths of the XY scribe lanes. The cutting process begins with dicing the first lane of the X-axis of the wafer. De-ionized water is flushed at a proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck rotates approximately 90 degree to align the Y-axis scribe lanes to be cut. The cutting motion is repeated until all the scribe lanes on the Y-axis have been completed. FIG. 6A represents a cross sectional view of the wafer along A-A' plane before dicing (wafer saw) process. FIG. 6B represents a cross sectional view of the wafer along A-A' plane after dicing (Wafer Saw) process. FIG. 6B has the un-patterned bare silicon 501 removed and each die is spaced out wider from the adjacent dies for illustration purpose.

Figure 7A:
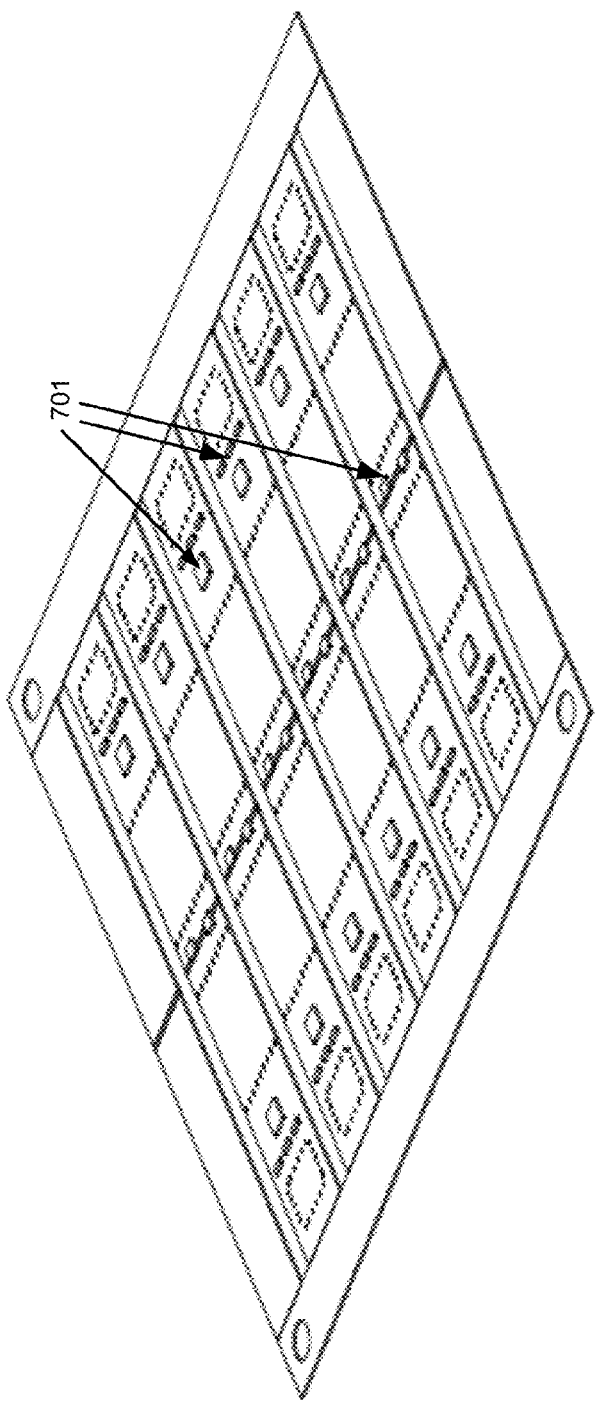
FIGS. 7A-7B show a PCB panel in different views as part of an SMT process according to one embodiment of the invention.
Figure 7B:
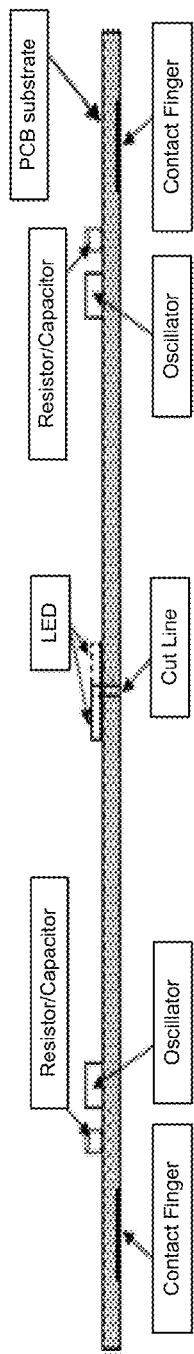

Referring back to FIG. 3, during SMT process 320, passive components such as capacitors and resistors are to be mounted onto a bottom surface of each of the individual single chip COB USB PCBs. The first stage of SMT process is to print lead-free solder on finger pads of the components using custom made stencil which is tailored to the design and layout of that particular single chip COB USB. After dispensing solder paste, the panel is then conveyed to a pick and place machine to mount resistors, capacitors, LEDs (optional), and oscillator components 701 thereon. Upon completion of pick and place components mounting process, the PCB panel is then passed through an IR-reflow oven with a correct temperature profile. The solder of each pad on the PC board is fully melted during the peak temperature zone of the oven and these melted solder connect all pins of the passive components to the finger pads of the PC board. Sub-assembled panel that has completed SMT process is shown in FIG. 7A and cross sectional view in FIG. 7B.

Referring back to FIG. 3, at block 346, a die bonding process is performed. During the die bonding process, controller and flash memory dies are attached onto their respective designated locations on the single chip COB USB PCB. During the die bonding station, an operator loads the diced wafers and the components mounted PCB panels onto die bonder machine. The machine will pick the first PCB panel from the bottom stack of the magazine and transport the PCB panel from a conveyor track to a die bond (DB) epoxy dispensing target area. The magazine will lower a notch automatically to get ready for the machine to pick up the second piece (the new bottom piece) in the next cycle of die bond operation. At the die bond epoxy dispensing target area, the machine will automatically dispense DB (die bonding) epoxy, using a pre-programmed write pattern and speed with a correct nozzle size, onto target areas of each of the PCB boards of the panel.

Figure 8A:
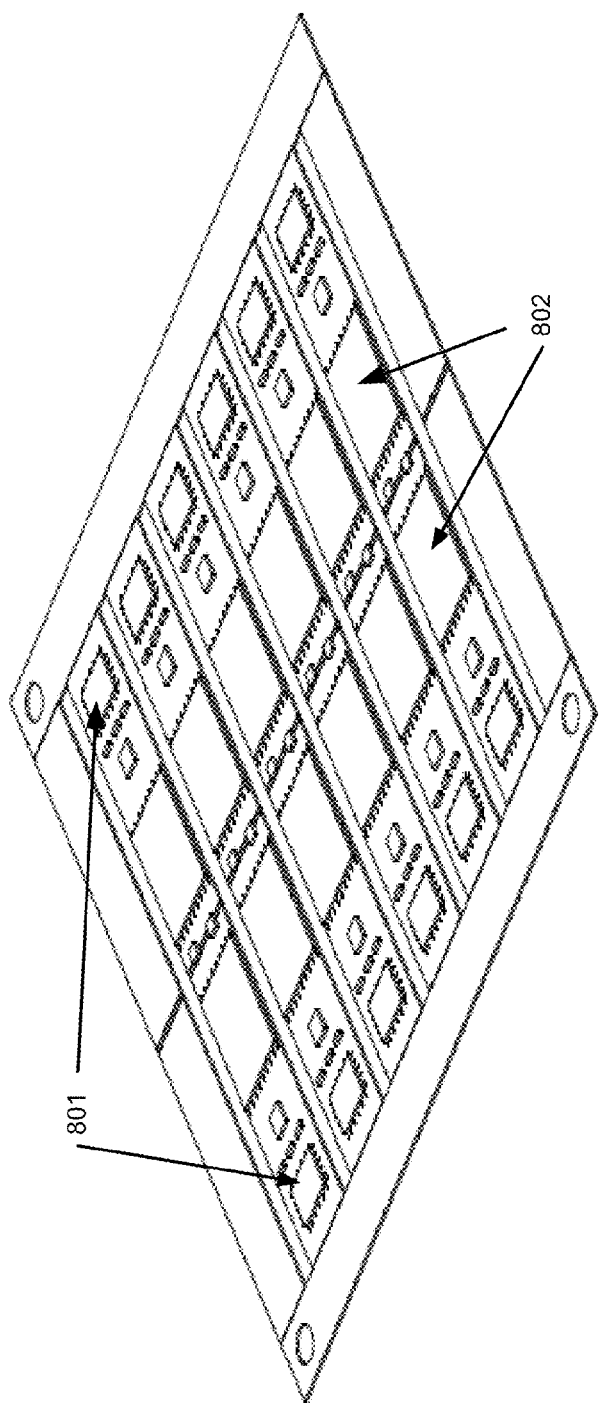
FIGS. 8A-8B show a PCB panel in different views as part of a die bonding process according to one embodiment of the invention.
Figure 8B:
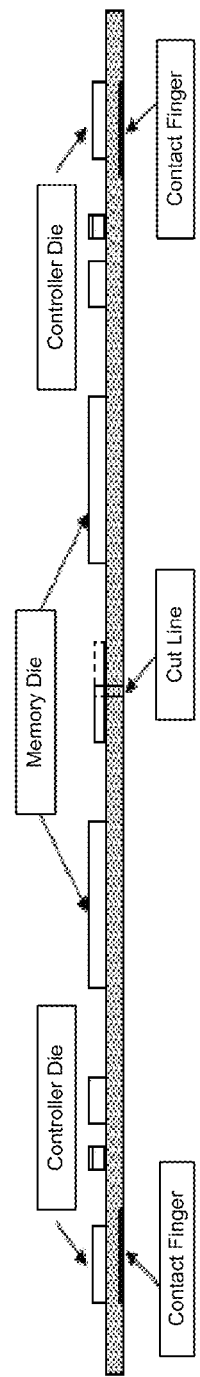

When all the PCB boards of the panel have completed epoxy dispensing, the panel is then conveyed to the die bonding (DB) target area. Meanwhile, at the input stage, the magazine is loading a second PCB panel to this vacant DB epoxy dispensing target area. At the Die bond target area, the pick up arm mechanism and collet (e.g., suction head with rectangular ring at the perimeter so that vacuum from the center can create a suction force) pick up a single controller die 801 from the diced wafer and bond it onto the PCB board area where epoxy has already dispensed for the bonding purpose as shown in FIGS. 8A-8B. Similar process procedure is repeated for SLC or MLC memory die 802 after the controller die attach process. Once all the PCB boards on the panel have completed die bonding process, the panel is then conveyed to the snap cure region where this panel passes through a chamber that has a heating element that radiates IR heat to cure the epoxy thermally in a relatively short time period.

After curing, the panel is conveyed into an empty slot of the magazine waiting at an output rack of the die bonding machine. The magazine will move up one slot after receiving a new panel to get ready for accepting the next panel in the second cycle of process. The die bonding machine will repeat the above operations until all the panels in the input magazine has exhausted. The above process may repeat again for the same panel for stack die products that may require to stacks more than one layer of memory die. FIG. 8A depicts the partial product after controller die 801 and memory die 802 have been attached at its designated locations. FIG. 8B shows a cross sectional view of the partial completed PCBA after the die attachment process.

Referring back to FIG. 3, after the die bonding process performed at block 346, a wire bonding process is performed at block 348. During the wire bonding process, partial processed PCB panels are loaded onto the magazine input rack of the wire bonder (WB) machine. The wire bonder is prepared with a correct wire bonding set-up and sequence program to process this specific single chip COB USB product. The coordinates of all the ICs' pads and PCB gold fingers were previously determined and programmed on the wire bonder. After the PCB panel with the attached dies is loaded onto the WB machine, the operator will teach the machine to use an optical vision to recognize a location of a first wire bond pin of a first flash memory die or first controller die of the first PCB on the panel. Once the first pin is correctly set, the machine can carry out the whole wire bonding process for the rest of the panels of the same product type automatically.

Figure 9A:
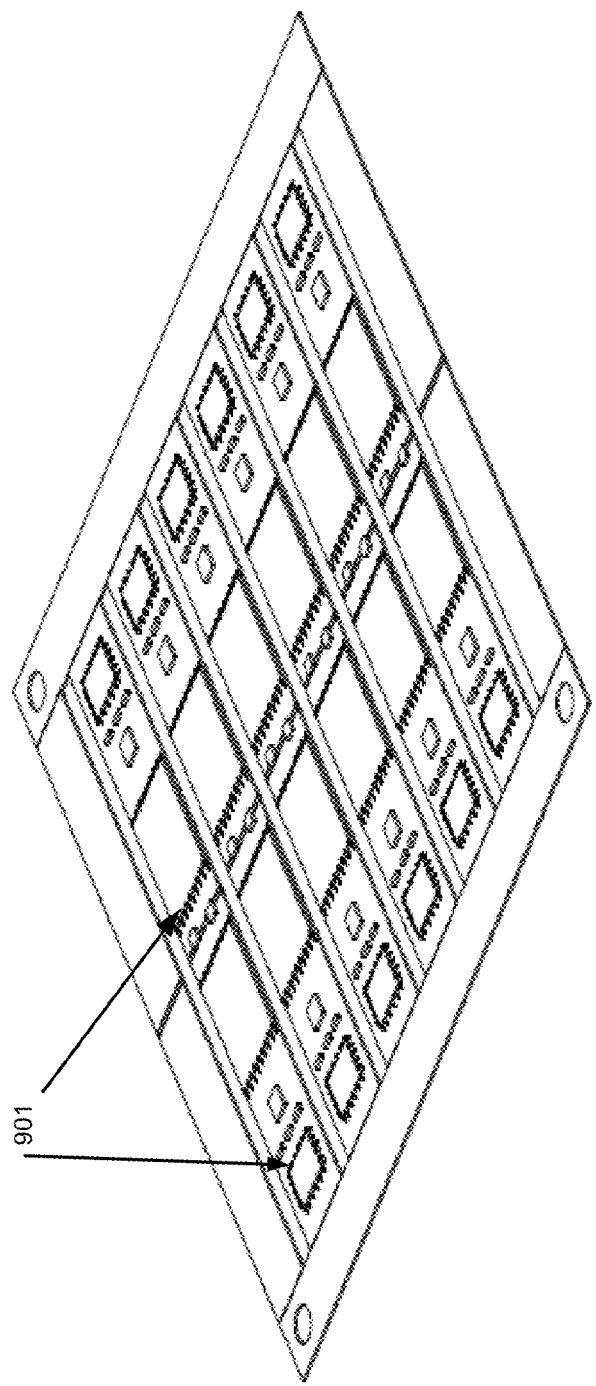
FIGS. 9A-9B show a PCB panel in different views as part of a wire bonding process according to one embodiment of the invention.
Figure 9B:
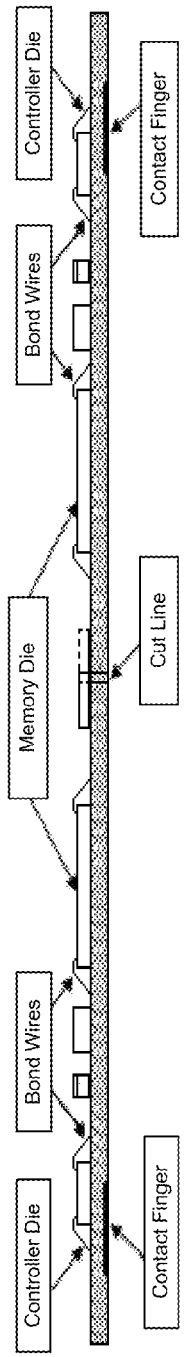

For two layers or more stack dies, the panels are looped back to the above operations to stack another flash memory die on a top of the wire bonded die and to repeat the wire bonding process. The loop between die bonding and wire bonding are repeated until the requested stacked layers have completed. FIG. 9A shows a panel of single chip COB USB PCB with all the memory dies and controller dies that have bonded with gold wires 901 between the die pads and the PCB finger pads. FIG. 9B shows a cross sectional view of the partial completed PCBA after the wire bond process.

Referring back to FIG. 3, after the wire bonding process performed by block 348, a molding process (also referred to herein as encapsulation process) is performed at block 350. Encapsulation (or molding) process is the main part of package formation of the manufacturing process method herein. In one embodiment, as shown in FIGS. 10A-10B, encapsulation (or molding) process' bottom mold block includes a bottom piece molding block 1000 which has an outer rim 1001 which is the highest surface of the block. Block cavity edge 1002 has a slightly larger outline than the PCB substrate panel of FIG. 9A. An outer edge 1001 is the highest surface of the block. Cavity 1003 depth defines the overall package thickness of the single chip COB USB. Cylindrical poles 1004 have the same height or less than the thickness of the PCBA of single chip COB USB. All three poles will align and hold the PCB substrate panel in place through the index and alignment holes 403 of FIG. 4.

There multiple run gates 1005 designed for molding compound to inject into the cavity from external of mold block. Plurality of ribs 1006 protruded from the cavity floor to the same height level as the top surface of the mold block allow the punched out region of the PCB to snug fit into these ribs to define the outer boundaries of the COB USB card. FIG. 10B shows a cross sectional view looking from 10H-10H' plane of the bottom piece molding block.

Figure 12A:
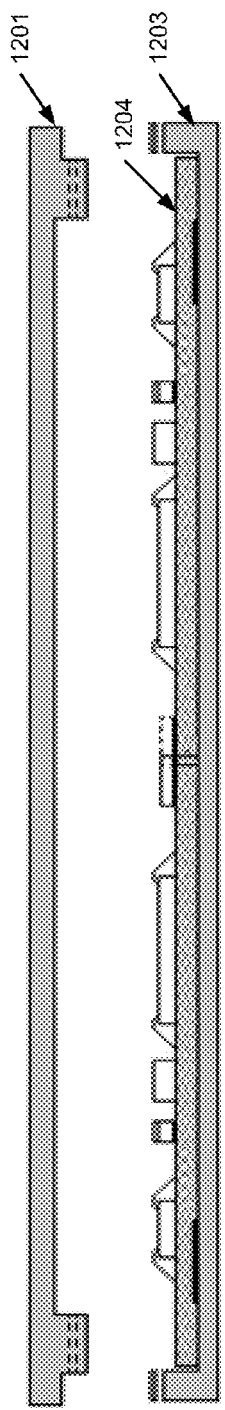
Figure 12B:
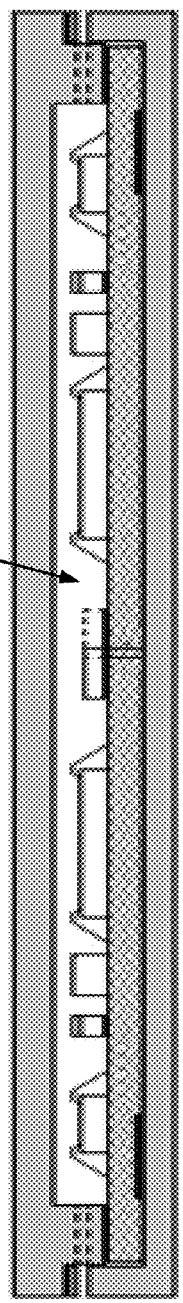

FIG. 11A shows the assembled PCBA panel 1102 loaded into the bottom mold block 1101. The ribs 1103 are fitted snugly into pre-punched out slots on the PCB. FIG. 11B shows a cross-sectional view of assembled PCB panel loaded into the bottom mold block. A transfer mold machine is used to encapsulate all the components and void area 1202 of all the single chip COB USB modules 1204 of the panel by lowering the top mold block 1201 onto the bottom mold block 1203 as shown in FIG. 12A. FIG. 12B shows a top and bottom mold blocks engaged in contact and closed position. Transfer molding method is preferred herein due to the high accuracy of transfer molding tooling and short cycle time of process.

Figure 12C:
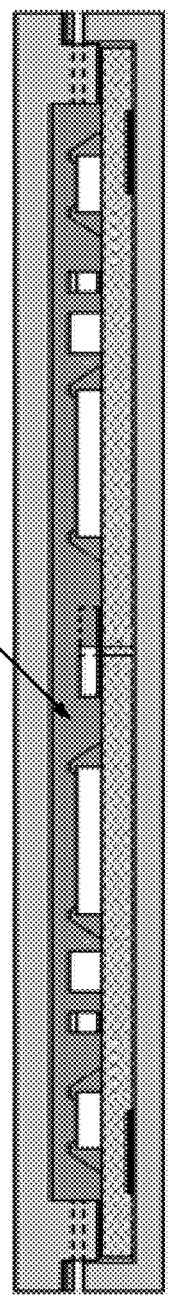

The molding material in a form of pellet is preheated and loaded into a pot (chamber). A screw drive push system is then used to force the material from the pot through channels known as a spruce and runner system into the mold cavities 1202. The mold remains closed as the material 1205 is injected and filled up all vacant spaces in the cavities. FIG. 12C shows the cavity of mold filled with plastic resin materials. During the molding process, the mold walls are heated to a temperature above a melting point of the mold material; this allows a faster flow of material through the cavities. The molds in transfer molding remain closed until the curing reaction within the material is complete.

Figure 13A:
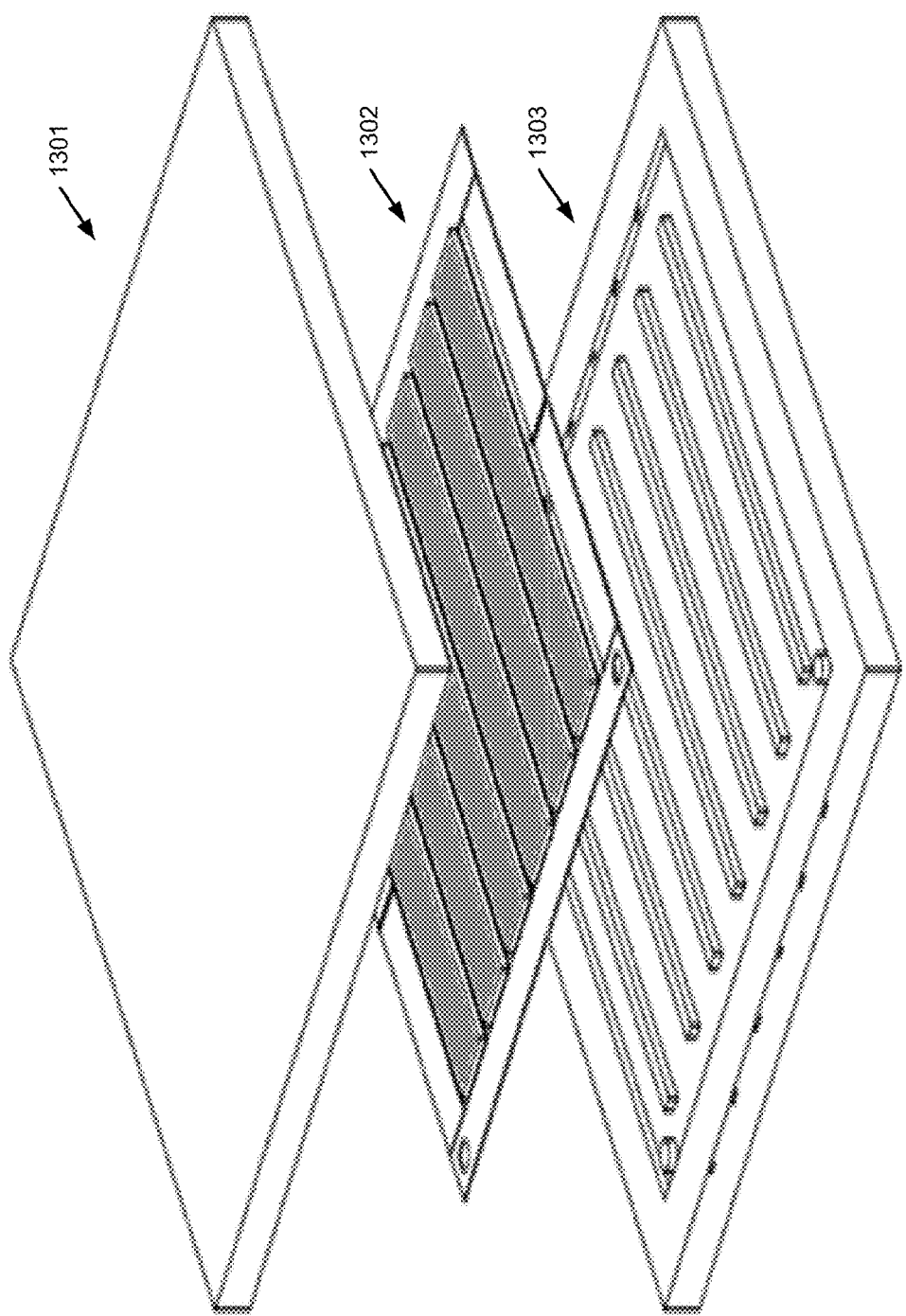
Figure 13B:
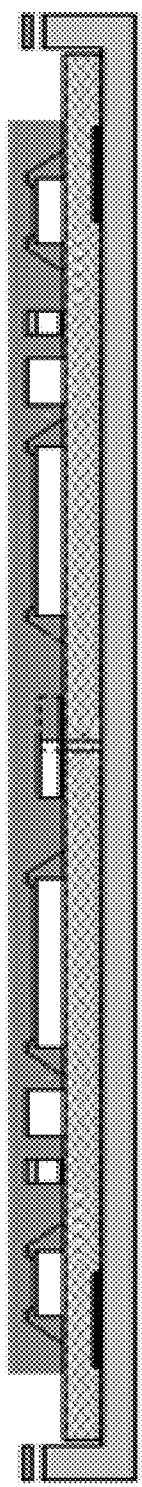
Figure 13C:
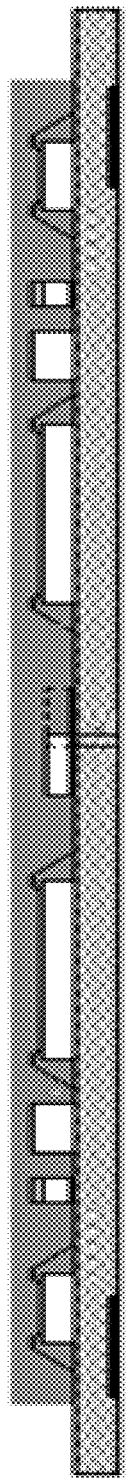
Figure 13D:
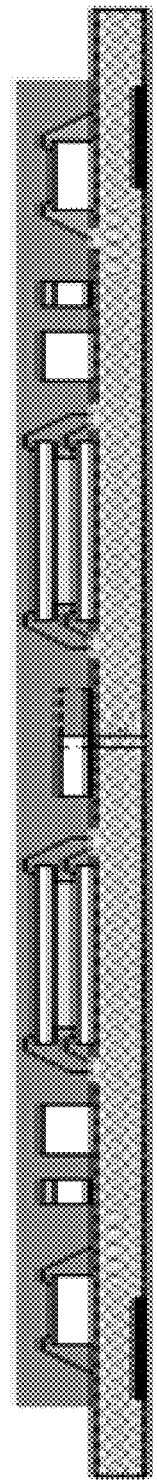

A cooling down cycle is followed and the molded materials start to solidify and harden. Ejector pins push the whole molded panel block from the mold once it has hardened. An exploded view of FIG. 13A shows top mold block 1301, molded PCBA panel 1302, and lower mold block 1303. Cross sectional views of FIGS. 13B-13C show the top mold block and bottom mold block being removed in sequence. FIG. 13C shows a cross sectional of one of the molded strips of the two back to back USB devices. In another embodiment, the memory dies can be multi-level stacked to two or more layers of SLC or MLC flash dies as shown in FIG. 13D.

Figure 14A:
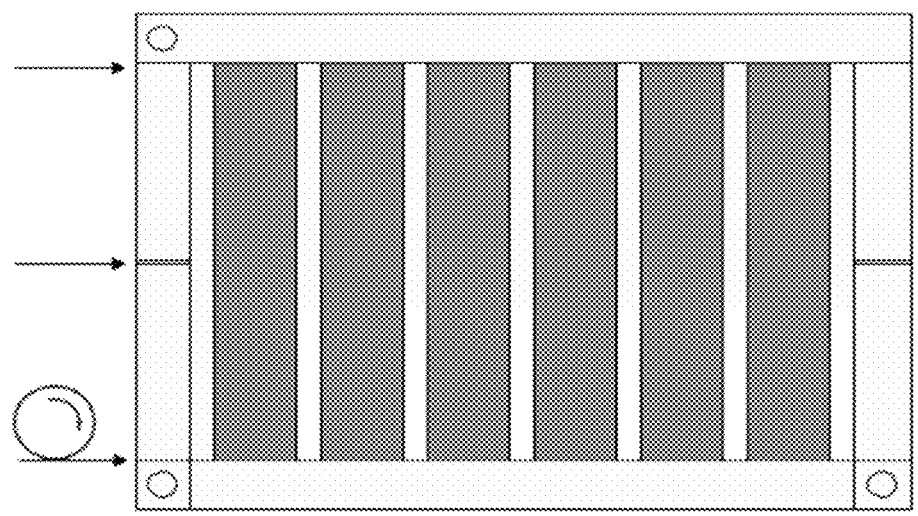
FIGS. 14A-15 show a PCB panel as part of a singulation process according to one embodiment of the invention.
Figure 14B:
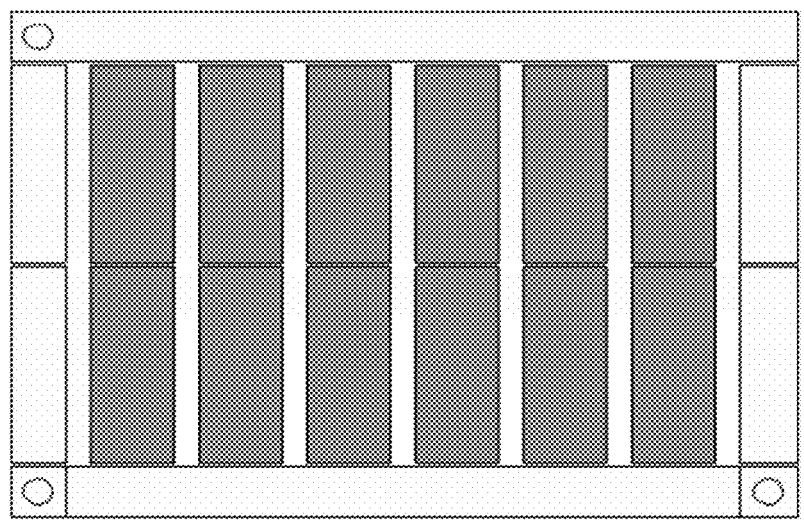
Figure 14C:
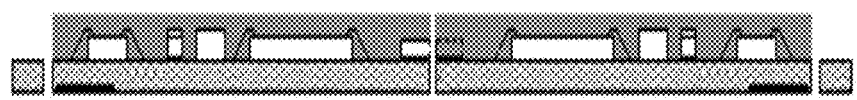

Referring back to FIG. 3, after the molding process performed at block 350, a singulation process is performed at block 360, which is configured to separate individual PCBs from the PCB panel. During the singulation process, the whole PCBA is taped onto a holder before loading onto a singulation machine. Singulation of the molded PCBA panel is performed using a disc saw to cut along the arrows pointed cut lines as shown in FIG. 14A. After singulation process, the COB USB devices are remaining on the tape as shown in FIG. 14B. FIG. 14C shows a cross sectional view of the singulated USB devices.

Figure 15:
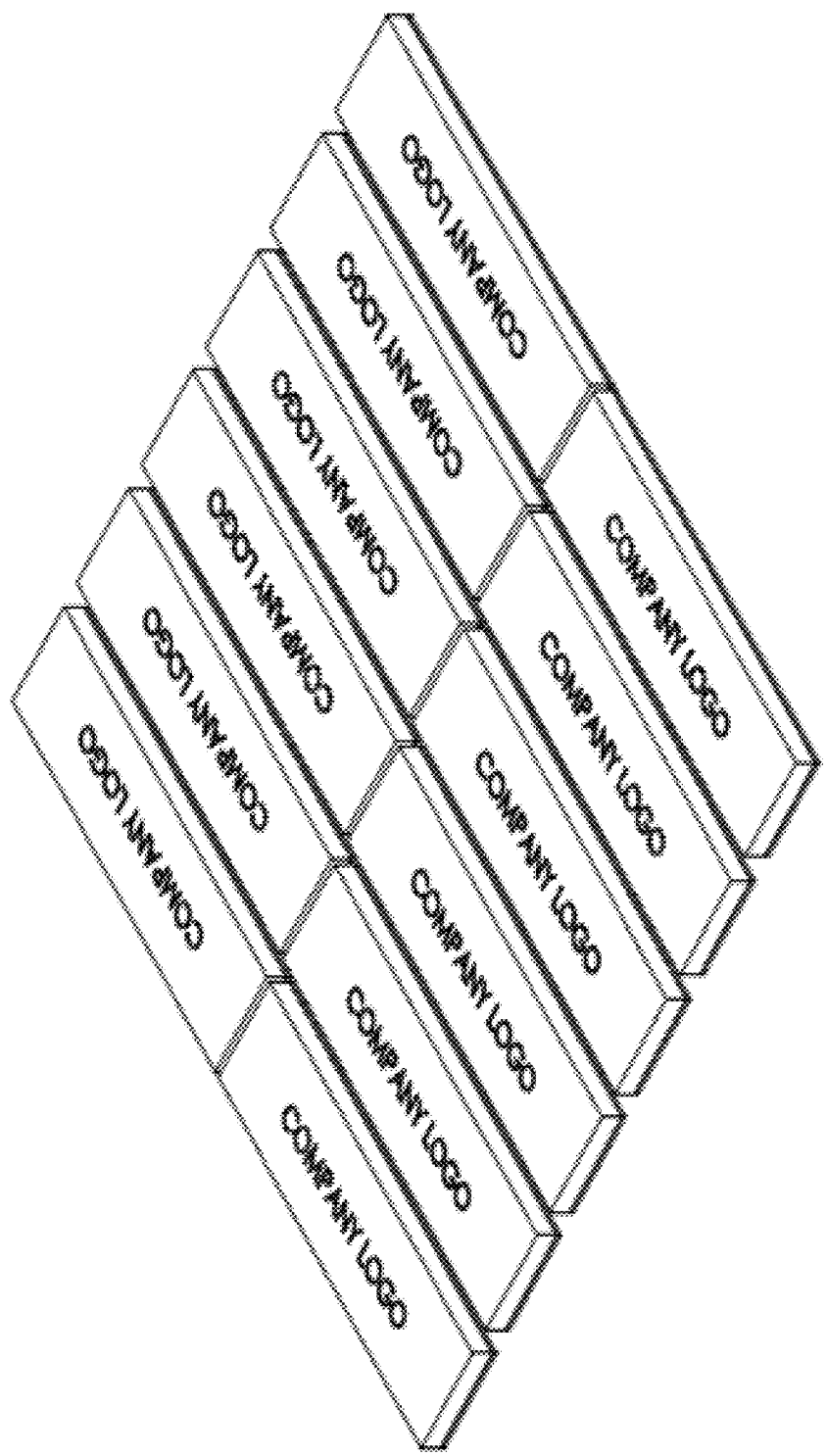

Referring back to FIG. 3, after the singulation process performed at block 360, a marking process is performed at block 370, during which single chip COB USB devices are now under go a marking process where company's logo, single chip COB USB logo, RoHs logo, speed value, density value, or other related information that the manufacturers choose to print it on. FIG. 15 shows an example of the bottom side of a post marking process memory card. After marking, the single chip COB USB devices are placed in a baking oven to cure the permanent ink. Subsequently, the individual single chip COB USB devices are peeled off from the tape manually after the marking process.

Referring back to FIG. 3, after the marking process performed at block 370, a test, packing, and shipping process is performed at block 380, during which the marked memory cards are then subjected to visual inspection and electrical tests. Visually or/and electrically test rejects are removed from the good population as defective rejects. The good memory cards are then packed into custom made boxes which are specified by customers. The final packed products will ship out to customers following correct procedures with necessary documents.

Figure 16B:
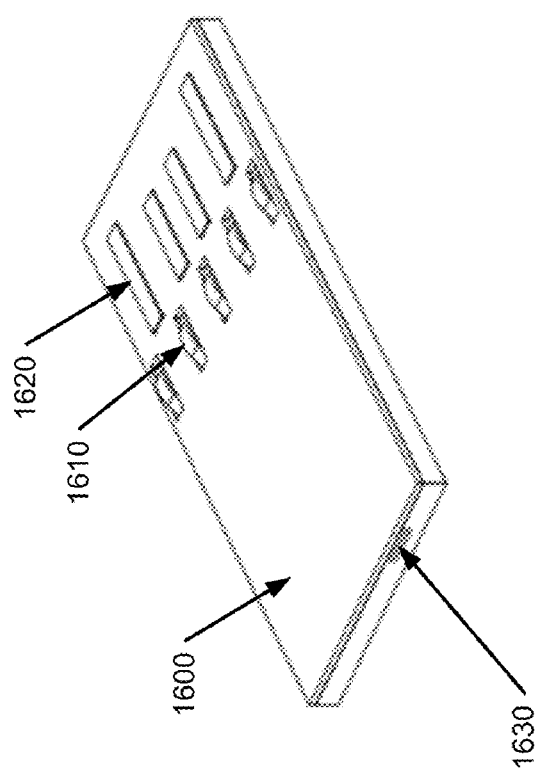
FIGS. 16A-16B show an extended USB device according to one embodiment of the invention.
Figure 16A:
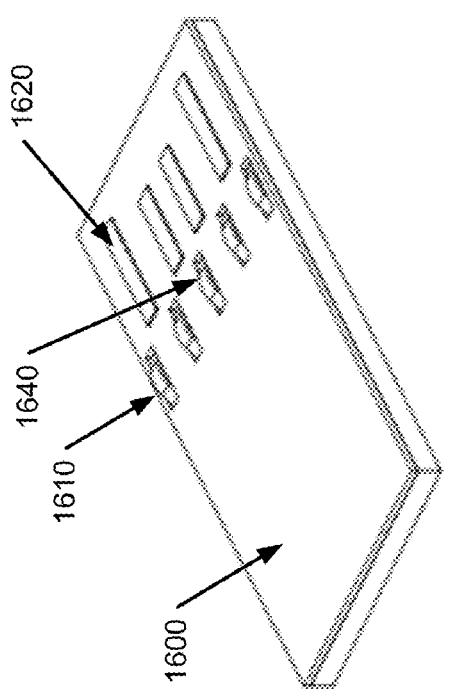

According to one embodiment, using the same process flow described above, EUSB (extended USB) devices can be processed with the addition of five more contact pins to a regular USB device. FIG. 16A shows alternative embodiment that has five additional contact pins (1610) mounted on the PCB panel (1600) during the SMT process performed at block 320 of FIG. 3 described in the manufacturing process above. These extended contact pins are spaced at a rear end of the regular USB's four pins connectors (1620). These extra five contact pins are added to provide transmitting pair and receiving pair with an additional ground pin 1640 layout at the center of the five pins. These additional pins enable the next generation of USB to speed up its read and write performance a few folds relative to the present USB 2.0. Another embodiment is shown in FIG. 16B with an optional LED 1630 embedded at the tail end of the EUSB 1600.

Figure 17A:
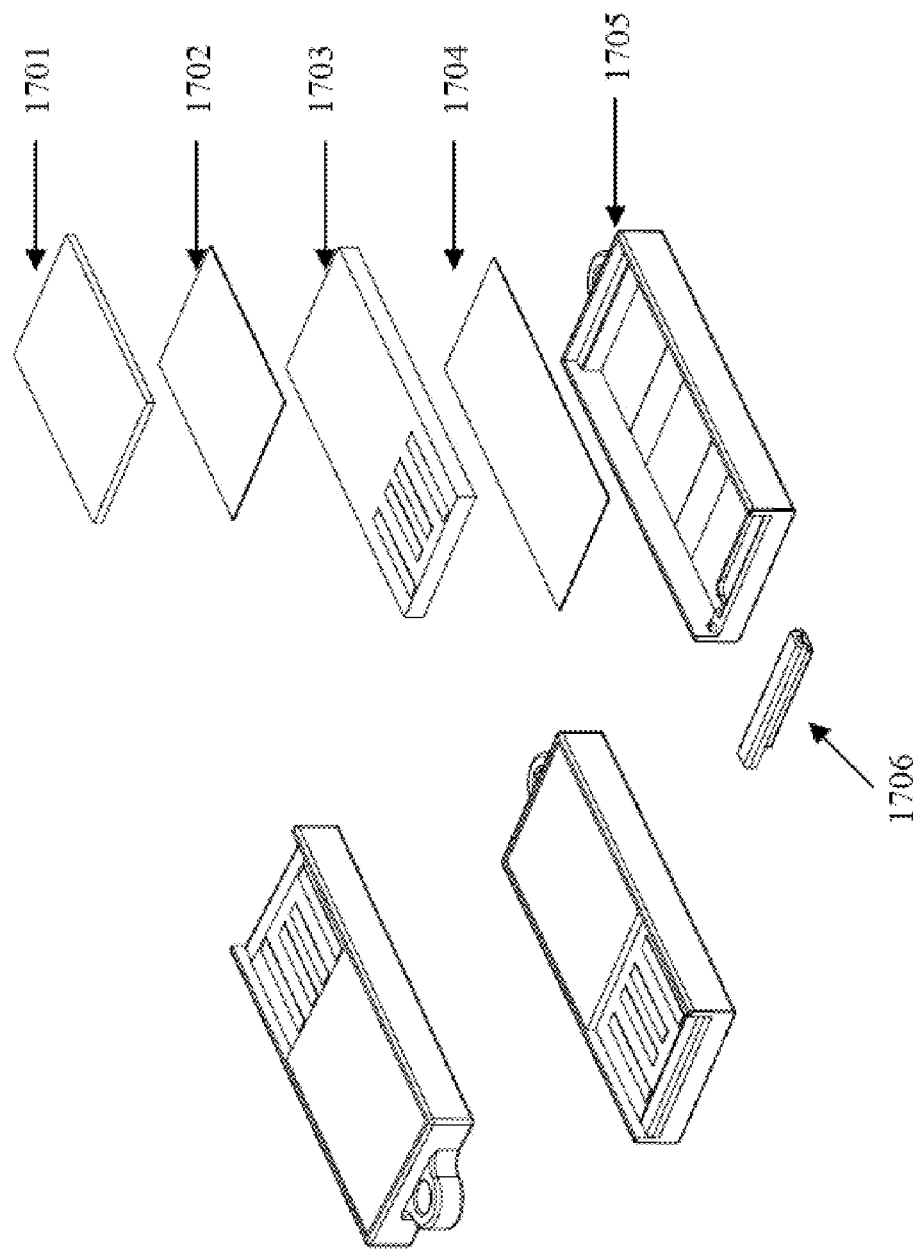
Figure 17B:
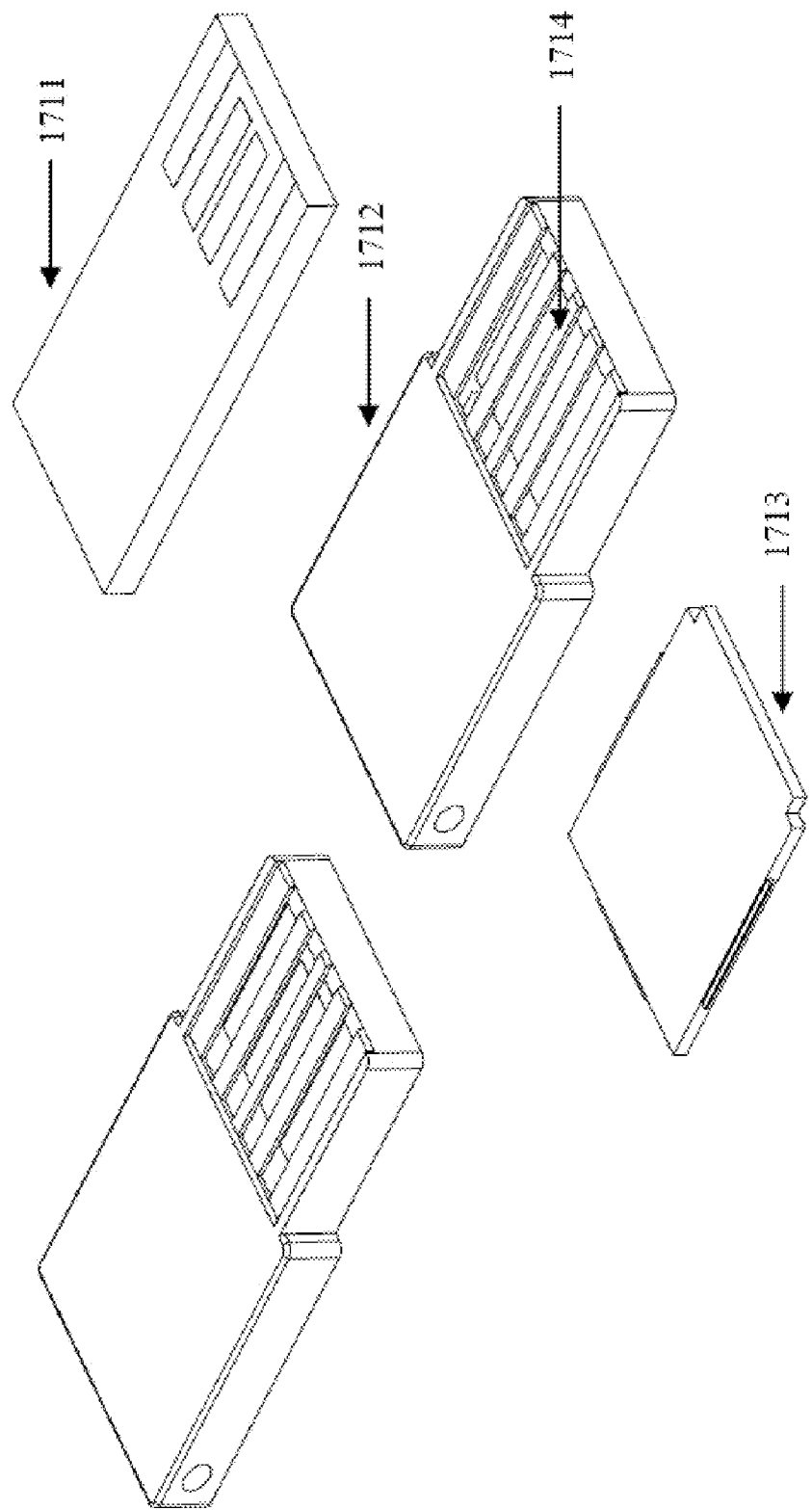
Figure 17E:
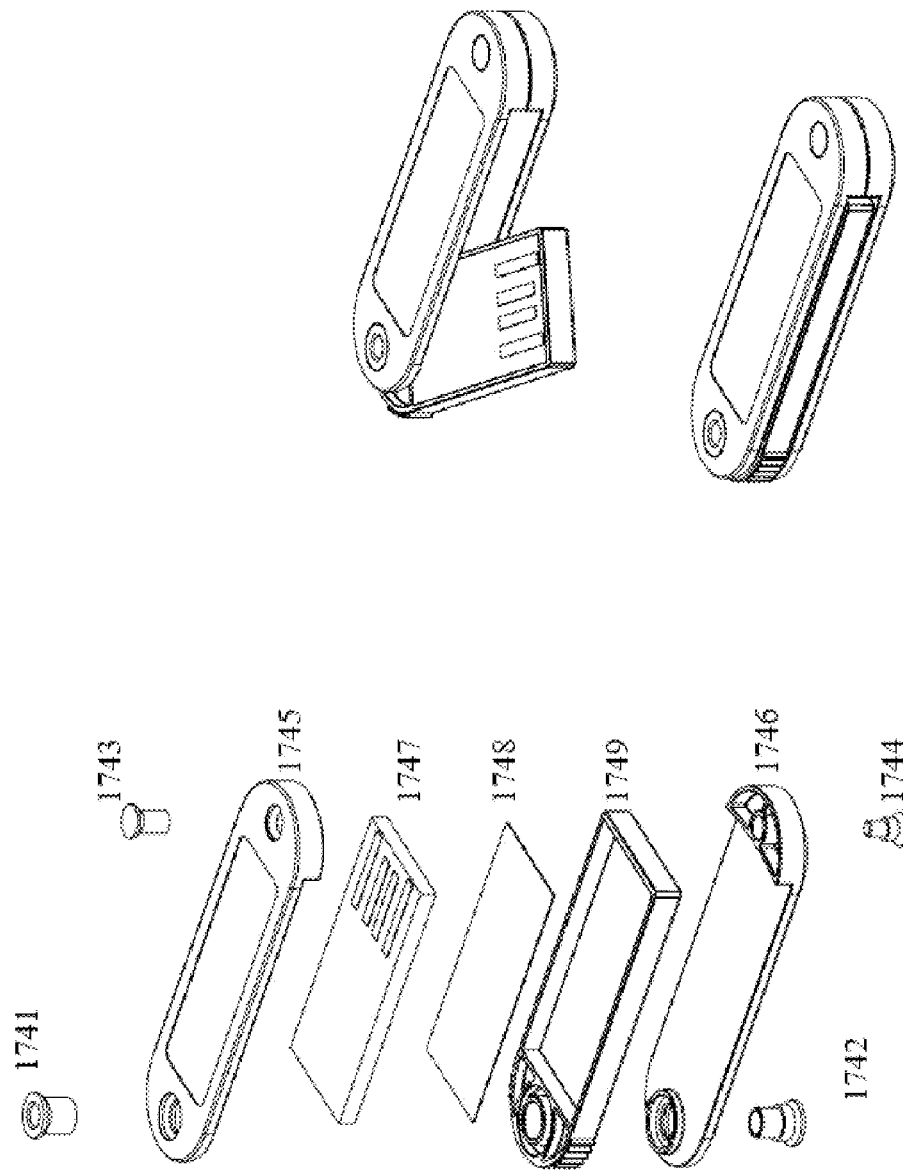

According to certain embodiments of the invention, the single chip COB USB device with an optional LED may be package in a variety of configurations, such as, for example, using top and bottom metal cases (1701 and 1705) with round key chain hole (1708), plastic front support (1706), COB USB card (1703) and adhesive films (1702 and 1704) as shown in FIG. 17A. Alternatively, such a single chip COB USB device (1711) can be package using plastic top and bottom housing (1712 and 1713) with front ribs (1714) and key chain hole (1715) as a slim USB device as shown in FIG. 17B. Furthermore, such a single chip COB USB device (1723) can be package using a metal swivel cover (1722), a plastic housing (1725), an adhesive film (1724), and a rivet (1721 and 1726) set as shown in FIG. 17C. Further, such a single chip COB USB device (1734) can be package using a metal swivel cover (one-direction rotatable 1732), a plastic housing (1736), an adhesive Film (1735), and a rivet set (1731 and 1733) as shown in FIG. 17D or alternatively, using a two-piece swivel cover (1745 and 1746) and two rivet sets (1741/1742 and 1743/1744) as shown in FIG. 17E. Other configurations may exist.

Figure 18:
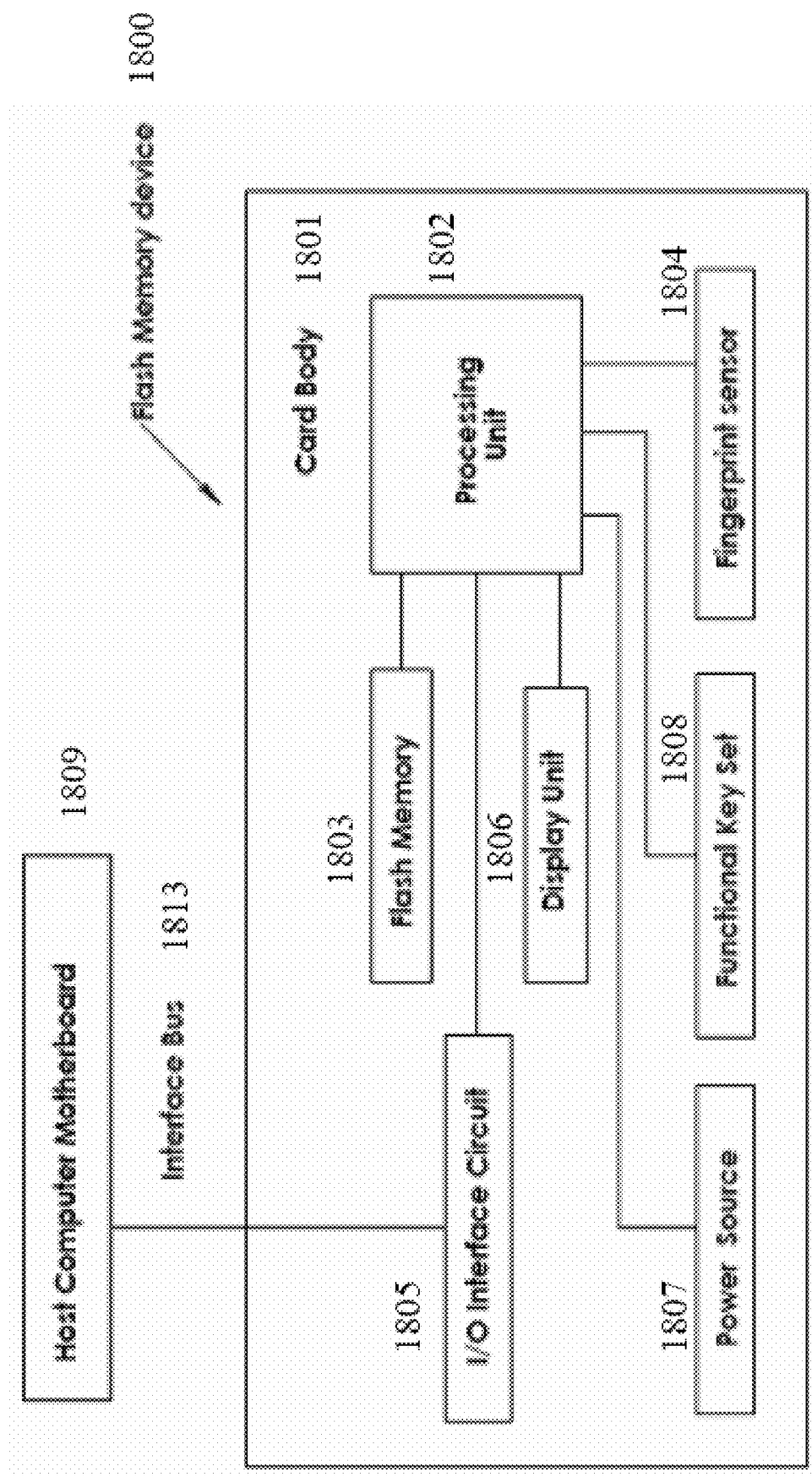
FIGS. 18 and 19 show certain embodiments of USB devices.

FIG. 18 is a block diagram illustrating a memory storage device which may be used with an embodiment of the invention. Referring to FIG. 18, an electronic data flash card 1800 is adapted to be accessed by a host computer motherboard 1809 either via an interface bus 1813, a card reader, or other interface mechanism (not shown), and includes a card body 1801, a processing unit 1802, one or more flash memory devices 1803, a fingerprint sensor 1804, an input/output interface circuit 1805, an optional display unit 1806, an optional power source (e.g., battery) 1807, and an optional function key set 1808.

Flash memory device 1803 is mounted on the card body 1801 which is a substrate for SMT (surface mount technology) manufacturing or a substrate for chip on board (COB) manufacturing, etc. Flash memory device 1803 stores in a known manner therein one or more data files, a reference password, and fingerprint reference data obtained by scanning a fingerprint of one or more authorized users of the electronic data flash card 1800. Only the authorized users can access the stored data files. The data file can be a picture file or a text file. The fingerprint sensor 1804 is mounted on the card body 1801, and is adapted to scan a fingerprint of a user of electronic data flash card to generate fingerprint scan data. The input/output interface circuit 1805 is mounted on the card body 1801, and can be activated so as to establish communication with the host computer motherboard 1809 by way of an appropriate socket via an interface bus or a card reader.

In one embodiment, input/output interface circuit 1805 includes circuits and control logic associated with a universal serial bus (USB) interface structure that is connectable to an associated socket connected to or mounted on the host computer motherboard 1809. The interface structure, for example, a universal serial bus (USB) connector includes an input/output (I/O) interface circuit configured for establishing USB bulk only transport (BOT) communications with a host computing device (host). There are four types of USB software communication data flow between the host and the I/O interface circuit of the flash memory device: control, interrupt, bulk, and isochronous.

Control transfer is a data flow over the control pipe from the host to the flash memory device to provide configuration and control information. Interrupt transfer is a small-data, non-periodic, guaranteed-latency, device-initiated communication typically used for notifying the host that a service is needed by the flash memory device. Movement of large blocks of data across the I/O interface circuit that is not time critical relies on a bulk transfer. Isochronous transfer is used when working with isochronous data. Isochronous transfers provide periodic, continuous communication between the host and the flash memory device.

There are two data transfer protocols generally supported by I/O interface circuits: control/bulk/interrupt (CBI) protocol and bulk-only transfer (BOT) protocol. The mass storage class CBI transport specification is approved for use with full-speed floppy disk drives, but is not used in high-speed capable devices, or in devices other than floppy disk drives (according to USB specifications). In accordance with an embodiment of the present invention, a flash memory device transfers high-speed data between the host and the flash memory device using only the BOT protocol, which is a more efficient and faster transfer protocol than CBI protocol because BOT transport of command, data, status rely on bulk endpoints in addition to default control endpoints.

In another embodiment, the input/output interface circuit may include one of a USB, secure digital (SD) interface circuit, peripheral component interconnect express (PCIe), radio frequency identification (RFID), etc., which interfaces with the host computer via an interface bus or a card reader The processing unit 1802 is mounted on the card body 1801, and is coupled to the flash memory device 1803, the fingerprint sensor 1804 and the input/output interface circuit 1805 by way of associated electrically conductive traces or wires disposed on card body 1801.

In one embodiment, processing unit 1802 is one of an 8051, 8052, 80286 microprocessors available, for example, from Intel Corporation. In other embodiments, processing unit includes a RISC, ARM, MIPS or other digital signal processors (DSP). In accordance with an embodiment of the present invention, processing unit 1802 is controlled by a program stored at least partially in flash memory device 1803 such that processing unit 1802 is operable selectively in: (1) a programming mode, where the processing unit activates the input/output interface circuit 1805 to receive the data file from the host computer motherboard 1809 and/or the fingerprint reference data from fingerprint sensor 1804 under the control of the host computer motherboard 1809, and store the data file and the fingerprint reference data in flash memory device 1803; (2) a data retrieving mode, where the processing unit 1802 activates the input/output interface circuit 1805 to transmit the data file stored in flash memory device 1803 to the host computer motherboard 1809; and (3) a data resetting mode, where the data file and the fingerprint reference data are erased from the flash memory device 1803.

In operations, host computer motherboard 1809 sends write and read requests to electronic data flash card 1800 via interface bus 1903 or a card reader and input/output interface circuit to the processing unit 1802, which in turn utilizes a flash memory controller (not shown or embedded in the processing unit) to read from and/or write to the associated one or more flash memory devices 1803. In one embodiment, for further security protection, the processing unit 1802 automatically initiates operations in the data resetting mode upon detecting that a preset time period has elapsed since the last authorized access of the data file stored in the flash memory device 1803.

The optional power source 1807 is mounted on the card body 1801, and is connected to the processing unit 1802 and other associated units on card body 1801 for supplying electrical power (to all card function) thereto. The optional function key set 1808, which is mounted on the card body 1801, is connected to the processing unit 1802, and is operable so as to initiate operation of processing unit in a selected one of the programming, data retrieving and data resetting modes. The function key set 1808 is operable to provide an input password to the processing unit 1802.

Figure 19:
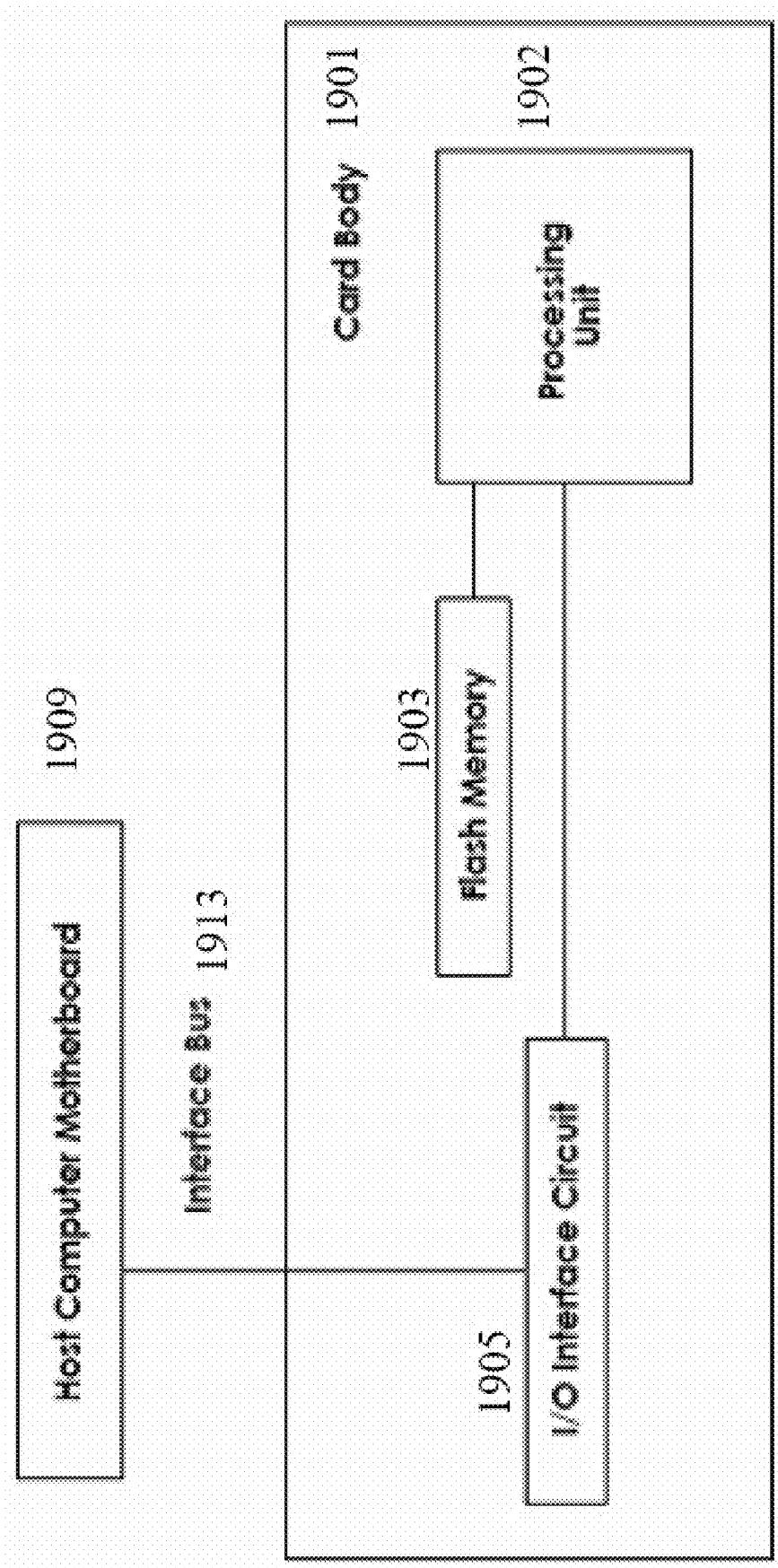

The processing unit 1802 compares the input password with the reference password stored in the flash memory device 1803, and initiates authorized operation of electronic data flash card 1800 upon verifying that the input password corresponds with the reference password. The optional display unit 1806 is mounted on the card body 1801, and is connected to and controlled by the processing unit 1802 for showing the data file exchanged with the host computer motherboard 1809, the function key set keying information and for displaying the operating status of the electronic data flash card. FIG. 19 is a block diagram illustrating a memory storage system according to yet another embodiment of the invention. Referring to FIG. 19, similar to the system as shown in FIG. 18, a fingerprint sensor is omitted. Instead, the fingerprint sensor may be implemented using the host 1909 such as notebook via interface bus 1913.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of fabricating flash memory devices, the method comprising:

provide a PCB (printed circuit board) panel having a plurality of PCB boards disposed in an N×M matrix such that the plurality of PCB boards can be separated with one or more single directional cuts, wherein each PCB corresponds to a single chip COB (chip-on-board) USB (universal serial bus) memory device to be manufactured;

performing an SMT (surface mount technology) process on the PCB panel to place one or more passive electronic components of a single chip COB USB memory device on a bottom surface of each PCB board, the one or more passive electronic components including at least one resister, capacitor, optional LED (light emitting diode), and oscillator;

performing a die bonding process to place one or more active electronic components of a single chip COB USB memory device on the bottom surface of each PCB board, the one or more active electronic components including a flash memory controller die and a flash memory die;

performing a wire bonding process to place electrical connections among the active and passive components of a single chip COB USB memory device on each PCB board;

performing an encapsulation process to encapsulate the active and passive electronic components of each PCB board to form an individual single chip COB USB memory device, using a transfer or injection molding process on the bottom surface of each PCB board which exposes a top surface of each PCB board with a plurality of metal contacts for physical and electrical contact with metal pads of a host interface socket when inserted.

2. The method of claim 1, further comprising performing a singulation process on the PCB panel after the molding process to separate the single chip COB USB memory devices from the PCB panel using a disc saw to perform the one or more single directional cuts.

3. The method of claim 2, wherein performing an encapsulation process comprises:

depositing the PCB panel into a bottom molding block, the bottom molding block including an outer rim that defines a highest surface of the bottom molding block, a block cavity edge that defines a slight larger outline than a dimension of the PCB panel, and a cavity depth that defines a package thickness of the flash memory devices;

lowering a top molding block onto the bottom molding block which encloses the PCB panel therein;

pouring molding material via one or more run gates of the top and bottom molding blocks into air space between the top and bottom molding blocks thereby encapsulating the PCB panel therein; and performing a curing operation on the molding material to allow the molding material hardens which forms the molded PCB panel having individual single chip COB USB memory devices.

* * * * *